United States Patent [19]
Yamada et al.

[11] Patent Number: 6,064,099
[45] Date of Patent: May 16, 2000

[54] LAYOUT OF WELL CONTACTS AND SOURCE CONTACTS OF A SEMICONDUCTOR DEVICE

[75] Inventors: Keiichi Yamada; Atsushi Maeda; Kenji Yoshiyama; Keiichi Higashitani, all of Tokyo, Japan

[73] Assignee: Mitsubishi Denki Kabushiki Kaisha, Tokyo, Japan

[21] Appl. No.: 09/285,044

[22] Filed: Apr. 1, 1999

[30] Foreign Application Priority Data

Oct. 13, 1998 [JP] Japan .................................. 10-290528

[51] Int. Cl.[7] ...................................................... H01L 29/41
[52] U.S. Cl. ............................................ 257/372; 257/773
[58] Field of Search .................................... 257/372, 373, 257/773, 774, 206, 207

[56] References Cited

U.S. PATENT DOCUMENTS

| | | |
|---|---|---|
| 4,621,276 | 11/1986 | Malhi . |
| 4,647,956 | 3/1987 | Shrivastava et al. . |
| 4,905,073 | 2/1990 | Chen et al. . |
| 5,753,944 | 5/1998 | Sakaue ...................................... 257/206 |
| 5,920,089 | 7/1999 | Kanazawa et al. ....................... 257/372 |

*Primary Examiner*—David Hardy
*Attorney, Agent, or Firm*—McDermott, Will & Emery

[57] ABSTRACT

There is described a semiconductor device intended to increase a degree of integration of transistor without impairing a desired element characteristic. An n-type source region and an n-type drain region are formed in a p-well which acts as a substrate region of an NMOS transistor. Further, there are formed a first contact plug to be electrically connected to the n-type source region and a second contact plug to be electrically connected to the n-type drain region. The n-type source region is provided so as to become short-circuited with the p-well. The n-type drain region is provided so as not to become short-circuited with the p-well. The n-type source region is formed so as to become smaller than the n-type drain region.

9 Claims, 15 Drawing Sheets

LAYOUT OF WELL CONTACTS AND SOURCE CONTACTS OF A SEMICONDUCTOR DEVICE

BACKGROUND OF THE INVENTION

1. Field of the Invention

The present invention relates to a semiconductor device, and more particularly, to a semiconductor device having a structure suitable for enhancing an integration degree of the same.

2. Description of the Background Art

FIG. 18 shows the layout of a mask (hereinafter referred to simply as a "mask layout") used for manufacturing a former semiconductor device. FIG. 19 is a cross-sectional view showing a semiconductor device manufactured through use of the mask layout shown in FIG. 18. As shown in FIG. 19, the former semiconductor device comprises a silicon substrate 10, and an n-well 12 and a p-well 14 formed on the silicon substrate 10. In the p-well 14 are formed a first diffusion region 16, a second diffusion region 18, and a p-type high-density region 20.

The first diffusion region 16 corresponds to an n-type semiconductor region used as the source region of a transistor and will be hereinafter referred to as an "n-type source region 16." The second diffusion region 18 corresponds to an n-type semiconductor region used as the drain region of the transistor and will be hereinafter referred to as an "n-type drain region 18." The high-density p-type impurity region 20 corresponds to a p-type semiconductor region containing impurities of the same conductivity type as those contained in the p-well 14 and at a density higher than that in the p-well 14. This region will be hereinafter referred to as a "well contact 20."

An isolation oxide film 22 is formed in the semiconductor device in order to divide the n-well 12 and the p-well 14 into predetermined regions. The well contact 20 is isolated from adjacent regions, i.e., the n-type source region 16 and the n-type drain region 18, by means of the isolation oxide film 22. A channel region is formed from a portion of the p-well 14 between the n-type source region 16 and the n-type drain region 18. A gate oxide film 24 and a gate electrode 26 are formed on top of the channel region 14. A sidewall 28 is formed on the side surface of the gate electrode 26, and a metal silicide ($CoSi_2$) layer 29 is formed on the respective surfaces of the N-type source region 16, the N-type drain region 18, and the well contact 20.

An interlayer oxide film 30 is formed on the isolation oxide film 22, the gate electrode 26, and the metal silicide layer 29. Contact holes 31 are formed in the interlayer oxide film 30 such that they reach respective areas in the vicinity of the n-type source region 16, in the vicinity of the n-type drain region 18, and in the vicinity of the well contact 20. A barrier metal layer 32 is grown on the surface of the interlayer oxide film 30 and the wall surface of each of the contact holes 31. A first contact plug 34, a second contact plug 36, and a well contact plug 38 are formed inside the individual contact holes 31.

An aluminum wiring layer 40 is formed on the interlayer oxide film 30 so as to become electrically connected to the first contact plug 34 and the well contact plug 38. An aluminum wiring layer 42 is formed on the interlayer oxide film 30 so as to become electrically connected to the second contact plug 36. As shown in FIG. 18, the semiconductor device further comprises a gate contact plug 44 electrically connected to the gate electrode 26. The semiconductor device is connected to an external element by way of the aluminum wiring layers 40 and 42 and the gate contact plug 44.

In FIG. 18, reference symbol DM1 denotes a distance between the edge of the n-type source region 16 and the first contact plug 34 over the mask layout. Similarly, DM2 denotes a distance between the edge of the n-type drain region 18 and the second contact plug 36 over the mask layout; SM1 denotes a distance between the first contact plug 34 and the gate electrode 26 over the mask layout; and SM2 denotes a distance between the second contact plug 36 and the gate electrode 26 over the mask layout.

In the former semiconductor device, the mask layout is determined such that DM1=DM2 and SM1=SM2. As DM1, DM2, SM1, and SM2 assume smaller values, the degree of integration of the semiconductor device is improved. However, if SM1 and SM2 are set so as to assume irrelevantly small values, the contact holes 31 for the first and second contact plugs 34 and 36 are apt to overlap the gate electrode 26. In this case, since a desired structure is not achieved, the characteristics of the transistor elements would deteriorate.

Further, if DM1=DM2 is set so as to assume an irrelevantly small values, the contact hole 31 for the second contact plug 36 is apt to jut out from the n-type drain region 18. If the contact hole 31 is formed so as to jut out from the n-type drain region 18, a portion of the isolation oxide film 22 is lost, thereby rendering the n-type drain region 18 and the p-well 14 more apt to become short-circuited. At the time of operation of the former semiconductor device, a potential differing from that of the p-well 14 flows into the n-type drain region 18. If a short circuit exists between the n-type drain region 18 and the p-well 14, the operating characteristic of the transistor is impaired.

In order to prevent these problems, in the mask layout of the former semiconductor device, the value of SM1=SM2 is determined so as to prevent the contact holes 31 for the first and second contact plugs 34 and 36 from overlapping with the gate electrode 26, and the value of DM1=DM2 is determined so as to prevent the contact holes 31 for the first and second contact plugs 34 and 36 from jutting out from the n-type source region 16 or the n-type drain region 18 without regard to various types of variations in the manufacturing process. Such a mask layout leads to high-yield manufacture of transistors having superior characteristics.

The former semiconductor device described above is used with the n-type source region 16 and the well contact 20 short-circuited, i.e., with the n-type source region 16 and the p-well 14 short-circuited. Therefore, even if the n-type source region 16 and the p-well 14 are short-circuited as a result of jutting of the contact hole 31 for the first contact plug 34 from the n-type source region 16, the operating characteristic of the transistor will not be deteriorated. If the short circuit between the n-type source region 16 and the p-well 14 is allowed, DM1 can be made smaller than DM2, thus enabling an increase in the degree of integration of the transistor. In this respect, the former technique which employs an identical value for DM1 and DM2 unnecessarily limits the degree of integration of the transistor.

SUMMARY OF THE INVENTION

The present invention has been conceived to solve the previously-mentioned problems, and a (general object of the present invention is to provide a novel and useful semiconductor device.

A more specific object of the present invention is to provide a semiconductor device having a structure suitable for improving an integration degree thereof without deterioration of a desired characteristic.

The above objects of the present invention are achieved by a semiconductor device described below. The semiconductor device includes in a substrate region thereof first and second diffusion regions, which are different in conductivity type from that of the substrate region. The device includes a first contact plug electrically connected to the first diffusion region as well as a second contact plug electrically connected to the second diffusion region. The first diffusion region is provided in such a way as to be short-circuited with the substrate region. The second diffusion region is used in such a way as to impart, to an area between the second diffusion region and the substrate region, an electric potential greater than that arising between the substrate region and the first diffusion region. The first diffusion region being smaller than the second diffusion region.

The above object of the present invention is also achieved by a semiconductor device described below. The semiconductor device includes in a substrate region first and second diffusion regions. The device further includes a dual-purpose contact plug electrically connected to both the first diffusion region and the substrate region as well as a second contact plug electrically connected to the second diffusion region.

The above object of the present invention is moreover achieved by a semiconductor device described below. The semiconductor device includes a transistor cell array made of a plurality of transistors. A transistor placed at the outermost position of the transistor memory array includes in a substrate region thereof first and second diffusion regions. The first diffusion region is provided so as to become short-circuited with the substrate region. The second diffusion region is provided so as to cause a great potential difference between the second diffusion region and the substrate region. The potential difference is greater than that arising between the substrate region and the first diffusion region. The first diffusion region is provided outside the second diffusion region includes.

Other objects and further features of the present invention will be apparent from the following detailed description when read in conjunction with the accompanying drawings.

DESCRIPTION OF THE PREFERRED EMBODIMENTS

Figure 1:
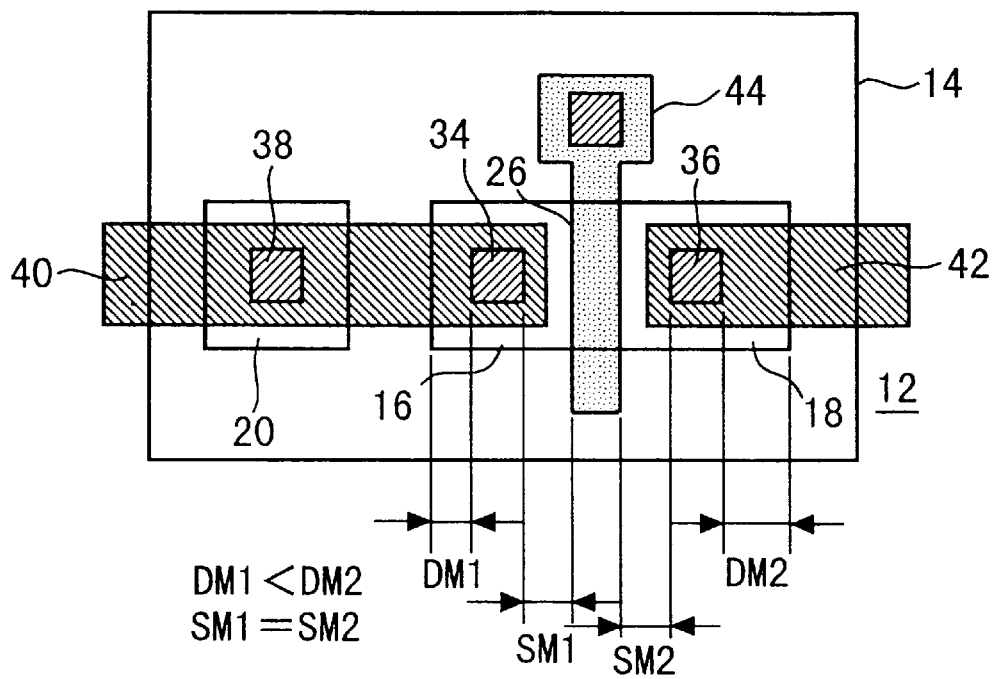
FIG. 1 is a plane view of a layout of a mask used for manufacturing a semiconductor device according to a first embodiment of the present invention.

In the following, principles and embodiments of the present invention will be described with reference to the accompanying drawings. The members that are common to some of the drawings are given the same reference numerals and redundant descriptions therefor may be omitted.

First Embodiment

Figure 2:
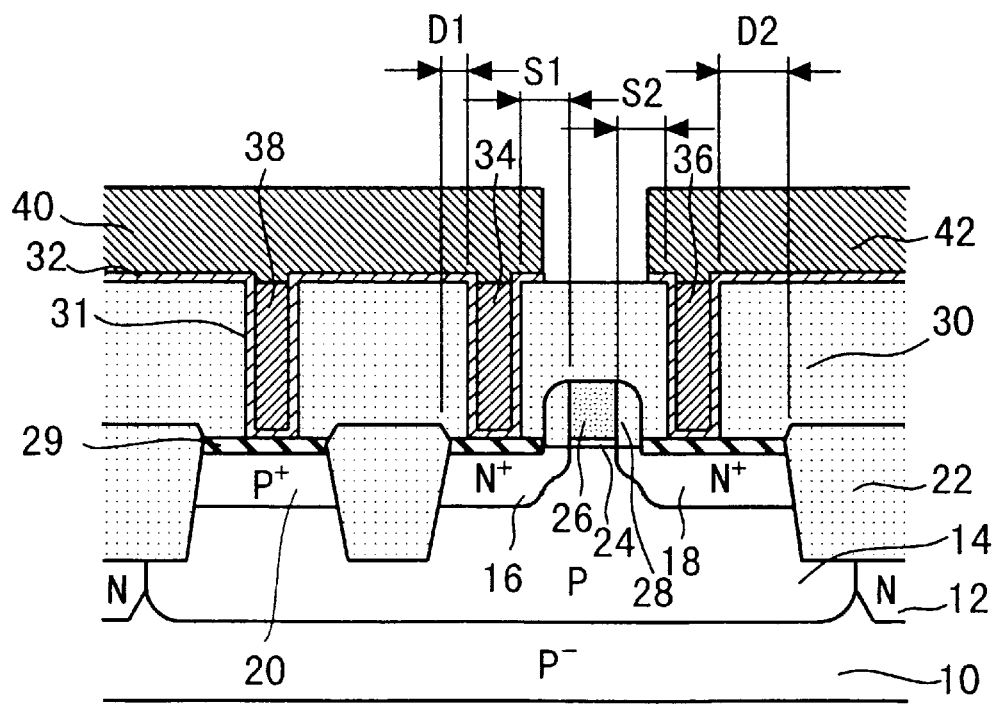
FIG. 2 is a cross-sectional view of the semiconductor device according to the first embodiment of the present invention.

FIG. 1 shows the layout of a mask (hereinafter referred to simply as a "mask layout") used for manufacturing a semiconductor device according to a first embodiment of the present invention. FIG. 2 is a cross-sectional view showing the semiconductor device according to the first embodiment. As shown in FIG. 2, the semiconductor device includes a silicon substrate 10. An n-well 12 and a p-well 14 are formed on the silicon substrate 10. In the p-well 14 there are formed a first diffusion region 16, a second diffusion region 18, and a p-type high-density region 20.

The first diffusion region 16 corresponds to an n-type semiconductor region used as the source region of a transistor (hereinafter referred to as an "n-type source region 16"). The second diffusion region 18 corresponds to an n-type semiconductor region used as the drain region of the transistor (hereinafter referred to as an "n-type drain region 18"). The high-density p-type impurity region 20 corresponds to a p-type semiconductor region containing impurities of the same conductivity type as those contained in the p-well 14 and at a density higher than that in the p-well 14 (hereinafter referred to as a "well contact 20").

An isolation oxide film 22 is formed in the semiconductor device in order to divide the n-well 12 and the p-well 14 into predetermined regions. The well contact 20 is isolated from adjacent regions by means of the isolation oxide film 22. A channel region is formed from a portion of the p-well 14 between the n-type source region 16 and the n-type drain region 18. A gate oxide film 24 and a gate electrode 26 are formed on top of the channel region 14. A sidewall 28 is formed on the side surface of the gate electrode 26, and a metal silicide (CoSi$_2$) layer 29 is formed on the respective surfaces of the N-type source region 16, the N-type drain region 18, and the well contact 20.

An interlayer oxide film 30 is formed on the isolation oxide film 22, the gate electrode 26, and the metal silicide layer 29. Contact holes 31 are formed in the interlayer oxide film 30 such that they reach respective areas in the vicinity of the n-type source region 16, in the vicinity of the n-type drain region 18, and in the vicinity of the well contact 20. A barrier metal layer 32 is grown on the surface of the interlayer oxide film 30 and the wall surface of each of the contact holes 31. A first contact plug 34, a second contact plug 36, and a well contact plug 38 are formed inside the individual contact holes 31.

An aluminum wiring layer 40 is formed on the interlayer oxide film 30 so as to become electrically connected to the first contact plug 34 and the well contact p)lug 38, and an aluminum wiring layer 42 is formed on the interlayer oxide film 30 so as to become electrically connected to the second contact plug 36. As shown in FIG. 1, the semiconductor device further comprises a gate contact plug 44 electrically connected to the gate electrode 26. The semiconductor device is connected to an external element by way of the aluminum wiring layers 40 and 42 and the gate contact plug 44.

Figure 3:
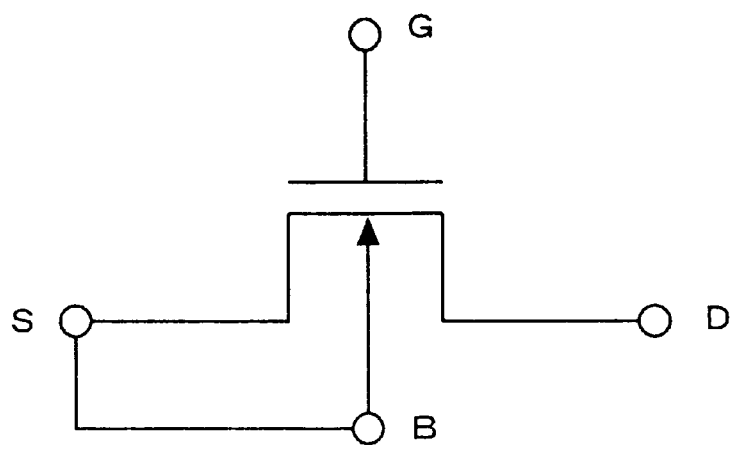
FIG. 3 shows an equivalent circuit of the semiconductor device according to the first embodiment.

FIG. 3 shows an equivalent circuit of the semiconductor device according to the first embodiment. As mentioned previously, in the semiconductor device according to the present embodiment, the n-type source region 16 is electrically connected to the well contact 20 by way of the first contact plug 34, the aluminum wiring layer 40, and the well contact plug 38. The well contact 20 is a p-type semiconductor containing impurities at high density. In this case, the well contact 20 is brought into conduction with the p-well 14, and good ohmic characteristics are ensured between the well contact plug 38 and the well contact 20. Accordingly, as shown in FIG. 3, the semiconductor device acts as a MOS transistor in which a substrate and a source are short-circuited.

In FIG. 1, reference symbol DM1 denotes a distance between the edge of the n-type source region 16 and the first contact plug 34 over the mask layout. Similarly, DM2 denotes a distance between the edge of the n-type drain region 18 and the second contact plug 36 over the mask layout; SM1 denotes a distance between the first contact plug 34 and the gate electrode 26 over the mask layout; and SM2 denotes a distance between the second contact plug 36 and the gate electrode 26 over the mask layout.

It should be noted that, in the present embodiment, each of DM1 and DM2 is defined as a distance between the corresponding contact hole 31 and the upper edge of the isolation oxide film 22; however, DM1 and DM2 are not limited to these definitions. For instance, each of DM1 and DM2 may be defined as a distance between the corresponding contact hole 31 and the lower edge of the isolation oxide film 22.

In FIG. 2, reference symbol D1 denotes an actual distance between the edge of the n-type source region 16 and the first contact plug 34; D2 denotes an actual distance between the edge of the n-type drain region 18 and the second contact plug 36; S1 denotes an actual distance between the first contact plug 34 and the gate electrode 26; and S2 denotes an actual distance between the second contact plug 36 and the gate electrode 26.

In the semiconductor device, the mask layout is determined such that DM1<DM2 and SM1=SM2. In other words, the mask layout is determined in such a way that the n-type source region 16 becomes narrower than the n-type drain region 18 in a widthwise direction (i.e., in a horizontal direction in FIGS. 1 and 2), as well as that SM1=SM2 is satisfied.

According to the mask layout, there are ensured two distances S1 and S2 being substantially equal to each other between the gate electrode 26 and the first contact plug 34 and between the gate electrode 26 and the second contact plug 36. The value of SM1=SM2 used for the mask layout is set to the minimum value required for avoiding interference between the gate electrode 26 and the first contact plug 34 and interference between the gate electrode 26 and the second contact plug 36, without regard to variations of manufacturing process. Therefore, the semiconductor device according to the first embodiment can ensure prevention of interference between the gate electrode 26 and the first contact plug 34 and interference between the gate electrode 26 and the second contact plug 36.

When the contact hole 31 for the second contact plug 36 is formed in such a position as to jut cut from the n-type drain region 18, a portion of the isolation oxide film 22 is apt to be lost, thereby rendering the n-type drain region 18 and the p-well 14 apt to become short-circuited. As shown in FIG. 3, the semiconductor device according to the first embodiment is used while a drain (D) region remains electrically disconnected from a substrate region (B). Thus, if the n-type drain region 18 and the p-well 14 become short-circuited, the characteristic of the transistor is impaired.

In the first embodiment, DM2 of the mask layout is set to the minimum value required for preventing the second contact plug 36 from jutting out from the n-type drain region 18 regardless of any variations of the manufacturing process. Thus, the mask layout enables prevention of a short circuit between the n-type drain region 18 and the p-well 14, thereby preventing the characteristic of the semiconductor device from being impaired.

If the contact hole 31 for the first contact plug 34 is formed in such a position as to jut out from the n-type source region 16, a portion of the isolation oxide film 22 is lost, thus rendering the n-type source region 16 and the p-well 14 apt to become short-circuited. So long as DM1 and DM2 used for the mask layout are set to identical values, the first contact plug 34 is prevented from jutting out from the n-type source region 16, thus ensuring prevention of a short circuit between the n-type source region 16 and the p-well 14. In contrast, as in the case with the present embodiment, if DM1 is set so as to become smaller in value than DM2, the degree of integration of the semiconductor device can be improved.

As shown in FIG. 3, the semiconductor device is used while a source (S) and the substrate region (B) are short-circuited. Therefore, the short circuit between the n-type source region 16 and the p-well 14 provides no change in the characteristic of the semiconductor device. Accordingly, the mask layout (DM1<DM2) enables an increase in the degree of integration of the semiconductor device without impairing the characteristic thereof.

Although in the present embodiment the contact plugs 34, 36, 38, and 44 are formed so as to assume a square cross section, the cross section may assume the shape of a circle or a rectangle. Further, although in the present embodiment the first contact plug 34 is formed within the n-type source region 16, the first contact plug 34 may jut out from the n-type source region 16, so long as at least a portion of the first contact plug 34 is in contact with the n-type source region 16. In terms of a reduction in the resistance of the source region of the transistor, the entire surface of the first contact plug 34 should desirably be within the n-type source region 16.

Most preferably, the semiconductor device should be manufactured in such a way that the dimensions DM1, DM2, SM1, and SM2 of the mask layout match the actual dimensions D1, D2, S1, and S2. However, there is no necessity for satisfying such a requirement at all times, and there nay be allowed, according to process conditions or the like, a certain degree of discrepancy between the dimensions of the mask layout and the actual dimensions.

Second Embodiment

A second embodiment of the present invention will now be described by reference to FIGS. 4 and 5.

Figure 4:
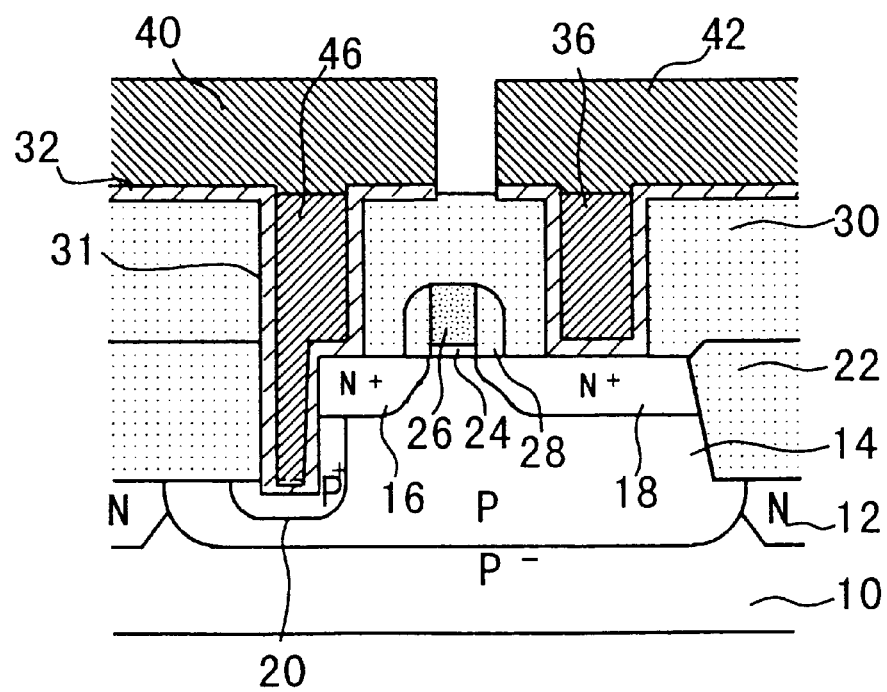
FIG. 4 is a cross-sectional view of a semiconductor device according to a second embodiment of the present invention.

FIG. 4 is a cross-sectional view showing a semiconductor device according to the second embodiment. As shown in FIG. 4, the semiconductor device comprises a dual-purpose contact plug 46. The dual-purpose contact plug 46 is at the lower end in contact with both the n-type source region 16 and the well contact (p-type high-density region) 20 which is of the same conductivity type as the substrate 10. With the structure set forth, the n-type source region 16 and the p-well 14 can be short-circuited without use of a well contact plug 38 shown in FIG. 2. More specifically, as in the case with the first embodiment, the source (S) of the transistor and the substrate region (B) can be short-circuited.

In the semiconductor device, a level difference portion is formed at an one end of the dual-purpose contact plug 46. The dual-purpose contact plug 46 is in contact with the n-type source region 16 at an upper portion of the level difference portion, as well as in contact with the well contact 20 at a lower portion of the same. Further, in the semiconductor device according to the second embodiment, a well contact 20 is formed so as to originate from a position beneath the dual-purpose contact plug 46 and to extend to the n-type source region 16. So long as the well contact 20 and the n-type source region 16 are formed in a three-dimensional manner as mentioned above, the area occupied by the well contact 20 and the n-type source region 16 is reduced, while ensuring of a sufficient contact area between the well contact 20 and the dual-purpose contact plug 46 as well as between the n-type source region 16 and the dual-purpose contact plug 46.

As mentioned above, the semiconductor device according to the second embodiment enables efficient arrangement of the well contact 20 and the n-type source region 16 without use of the well contact plug 38, as well as implementation of a structure in which the source (S) and the substrate region (B) are short-circuited. In the semiconductor device according to the second embodiment, there can be ensured a large contact area between the dual-purpose plug 46 and the well contact 20, thus enabling ensuring of a superior ohmic characteristic and a sufficient reduction in the resistance of a wiring layer between the dual-purpose contact plug 46 and the well contact 20. For these reasons, the semiconductor device according to the second embodiment enables a higher integration degree than that according to the first embodiment without deterioration of the characteristic of the transistor.

A method of manufacturing the semiconductor device according to the second embodiment will now be described by reference to FIGS. 5A through 5F.

Figure 5A:
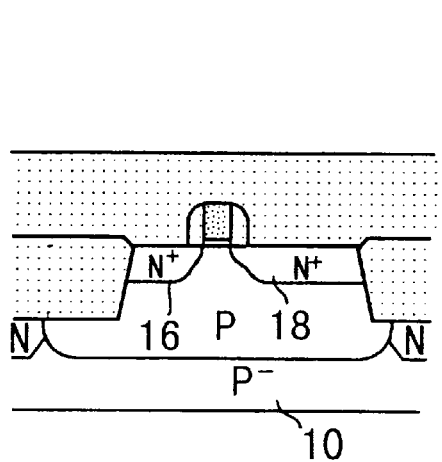
FIGS. 5A through 5F are cross-sectional views for describing a manufacturing method of the semiconductor device according to the second embodiment of the present invention.

During the process of manufacture of the semiconductor device, the n-type source region 16, the n-type drain region 18, and an interlayer oxide film 30 are formed on the silicon substrate 10 by means of a known technique (FIG. 5A).

Figure 5B:
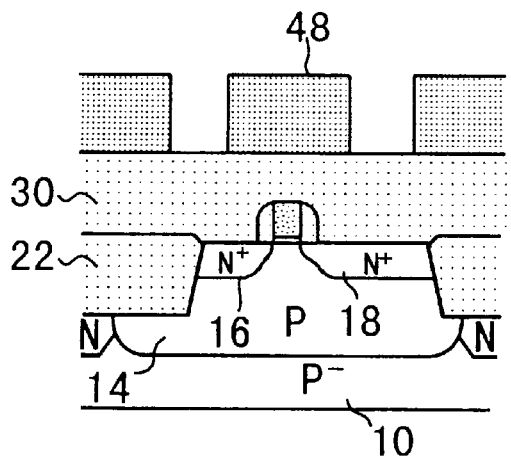

On the interlayer oxide film 30 is formed a resist pattern 48 used for forming a contact hole 31 for use with the dual-purpose contact plug 46 and another contact hole 31 for use with the second contact plug 36 (FIG. 5B).

Figure 5C:
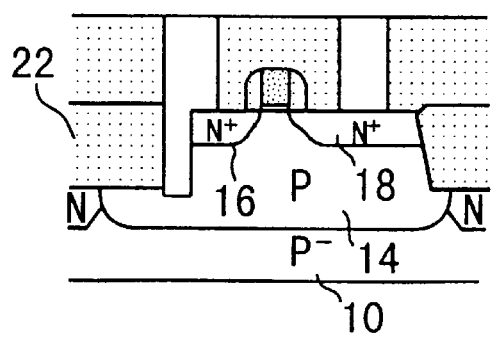

The silicon substrate 10 is exposed to a dry etching step while the resist pattern 48 is used as a mask. As a result, the contact hole 31 for use with the dual-purpose contact plug 46 is formed in such a position as to jut out from the n-type source region 16. Further, the contact hole 31 for use with the second contact plug 36 is formed on the n-type drain region 18. After opening of the contact holes 31, the resist pattern 48 is removed from the top of the interlayer oxide film 30 (FIG. 5C).

The silicon substrate 10 is subjected to dry etching under condition that a silicon oxide film is removed at a high etching selective ratio relative to silicon. More specifically, the silicon substrate 10 is subjected to dry etching under condition that the interlayer oxide film 30 and the isolation oxide film 22 are selectively removed relative to the n-type source region 16, the n-type drain region 18, and the p-well 14. In the second embodiment, the silicon substrate 10 is continually subjected to dry etching until the contact hole 31 reaches the bottom of the isolation oxide film 22. The dry etching process may be completed before the contact hole 31 reaches the bottom of the isolation oxide film 22. However, in order to reduce contact resistance between the p-well 14 and the double-contact plug 46, it is preferable to cause the contact hole 31 to reach the bottom of the isolation oxide film 22 for ensuring a large contact area between the p-well 14 and the dual-purpose contact plug 46.

Figure 5D:
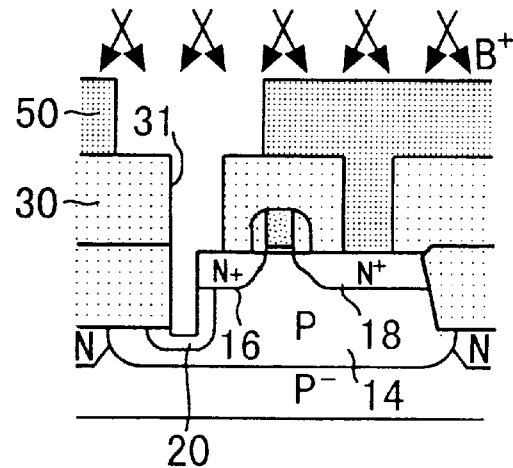

After the opening of the contact holes 31, a resist pattern 50 is formed in such a way as that an opening is present in the area including the dual-purpose contact plug 46. Impurities of the same conductivity type as those contained in the substrate region (e.g., B ions in the second embodiment) are implanted into the exposed substrate region at the bottom of the dual-purpose contact plug 46 (i.e., the p-well 14 in the second embodiment) from above the resist pattern 50. The impurities are of the same conductivity type as those contained in the exposed substrate region (e.g., B ions in the second embodiment). The impurities are implanted at a given angle with respect to the silicon substrate 10 while the silicon substrate 10 is rotated. Through the foregoing processing, a well contact 20 (a p-type high-density region) is formed in the contact hole 31 for use with the dual-purpose contact plug 46 (FIG. 5D).

In order to ensure a superior ohmic characteristic between the dual-purpose contact plug 46 and the n-type source region 16, it is desirable that the concentration of B ions to be implanted into the n-type source region 16 does not exceed the concentration of ions (e.g., P ions or As ions) contained in the n-type source region 16 from the beginning. To this end, according to the second embodiment, impurities required for forming a well contact (a p-type high-density region) 20 are implanted under conditions which satisfy such a requirement.

Figure 5E:
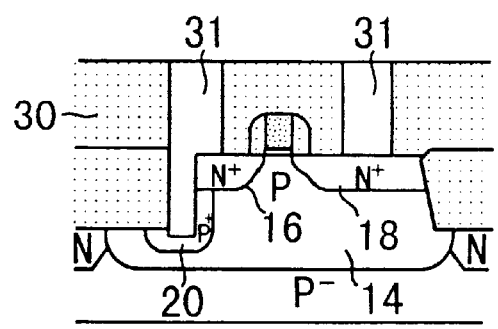

After formation of the well contact 20, the resist pattern 50 is removed from the top of the interlayer oxide film 30, and the silicon substrate 10 is annealed in order to activate the impurities (FIG. 5E).

Figure 5F:
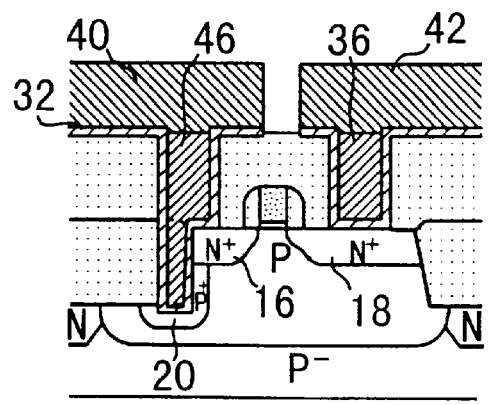

After being annealed, the silicon substrate is exposed to a step of growing the barrier metal layer 32, a step of forming the dual-purpose contact plug 46 and the second contact plug 36, and a step of forming the aluminum wiring layers 40 and 42, thereby completing manufacture of the semiconductor device according to the second embodiment (FIG. 5F).

Third Embodiment

A third embodiment of the present invention will now be described by reference to FIGS. 6 to 7D.

Figure 6:
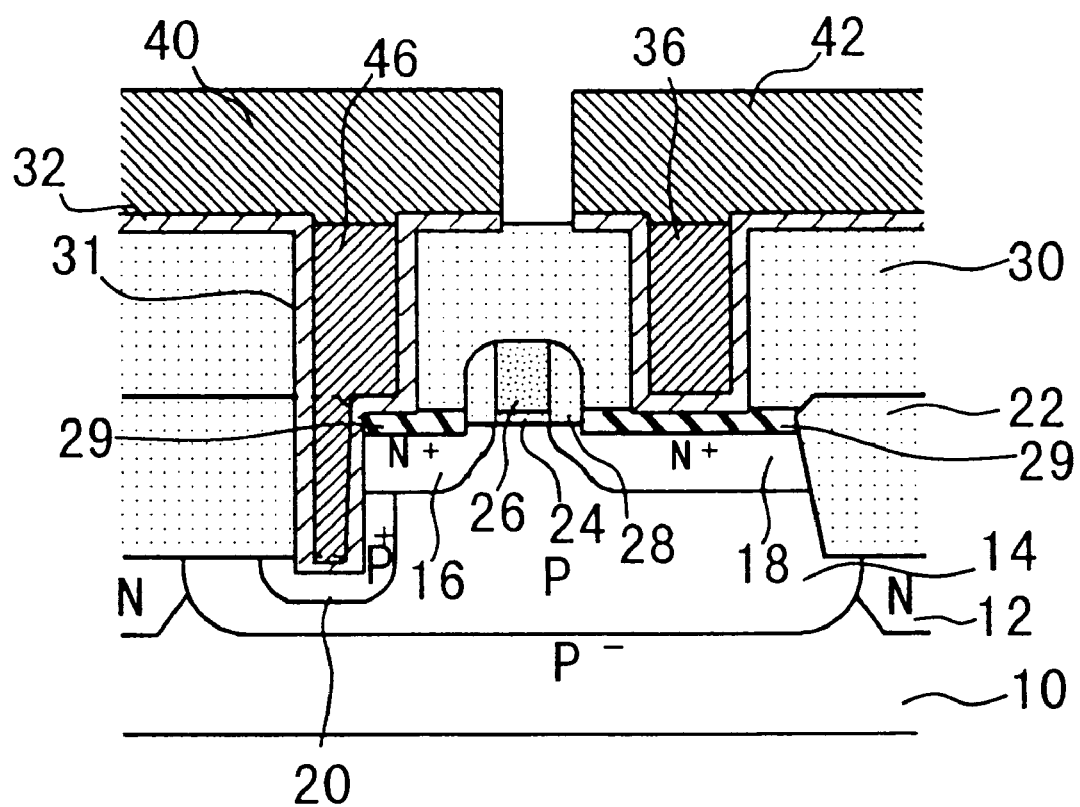
FIG. 6 is a cross-sectional view of a semiconductor device according to a second embodiment of the present invention.

FIG. 6 is a cross-sectional vies showing a semiconductor device according to the third embodiment. A semiconductor device according to the third embodiment is identical in structure with that according to the second embodiment, except that the metal silicide ($CoSi_2$) layer 29 is formed on the surface of the n-type source region 16 and on the surface of the n-type drain region 18.

The metal silicide layer 29 enables a reduction in contact resistance between the n-type source region 16 and the dual-purpose contact plug 46 and a reduction in contact resistance between the n-type drain region 18 and the second contact plug 36. Accordingly, the semiconductor device according to the third embodiment enables realization of a transistor having a wiring resistance lower than that of the semiconductor device according to the second embodiment.

A method of manufacturing the semiconductor device will now be described by reference to FIGS. 7A to 7D.

Figure 7A:
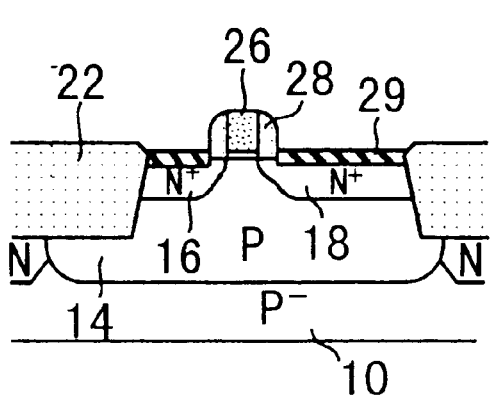
FIG. 7A through 7D are cross-sectional views for describing a manufacturing method of the semiconductor device according to the third embodiment of the present invention.
Figure 7B:
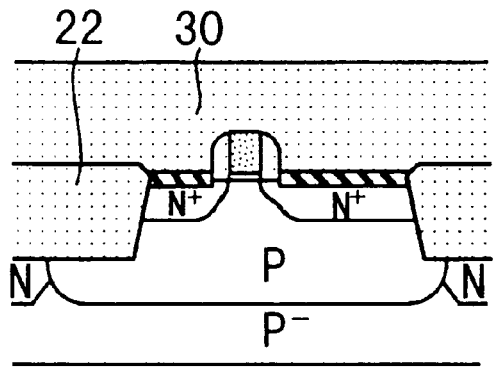

During the process of manufacture of the semiconductor device, the n-type source region 16 and the n-type drain region 18 are formed on the silicon substrate 10 by means of a publicly known technique. Subsequently, the metal silicide layer 29 is formed on the surface of the n-type source region 16 and the n-type drain region 18 by means of publicly-known salicide processes (FIG. 7A).

Figure 7C:
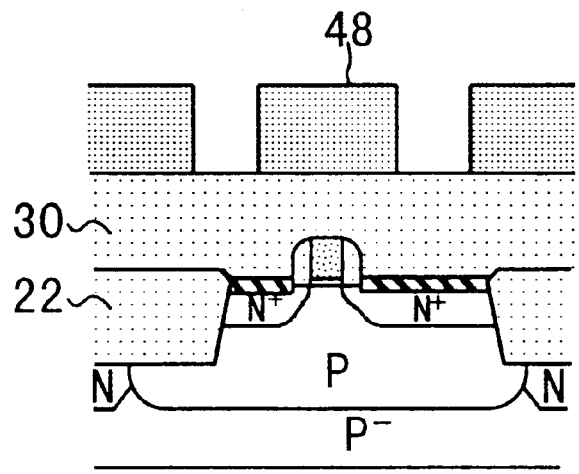
Figure 7D:
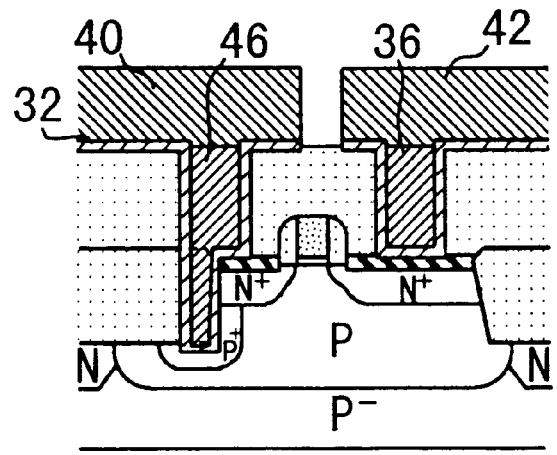

After the interlayer oxide film 30 has been deposited on the metal silicide layer 29 and the isolation oxide film 22 (FIG. 7B), a resist pattern 48 to be used for opening the contact holes 31 is formed (FIG. 7C). Subsequently, the silicon substrate 10 is exposed to the same processing steps as those employed in the second embodiment, whereby the semiconductor device is formed (FIG. 7D).

During the previously-described manufacturing processes, the contact holes 31 are opened through dry etching suited to remove a silicon oxide film. During the etching process, the metal silicide layer 29 hinders the progress of etching action more effectively than does the silicon film. In other words, if the n-type source region 16 and the source 18 are covered with the metal silicide layer 29, the interlayer oxide film 30 and the isolation oxide film 22 can be etched at a higher etching selective ratio than in the case where the n-type source region 16 and the source 18 are in an uncovered state. Accordingly, the structure of the semiconductor device enables realization of dimensional accuracy superior to that achieved by the second embodiment.

Fourth Embodiment

A fourth embodiment of the present invention will now be described by reference to FIG. 8 to FIG. 9H.

Figure 8:
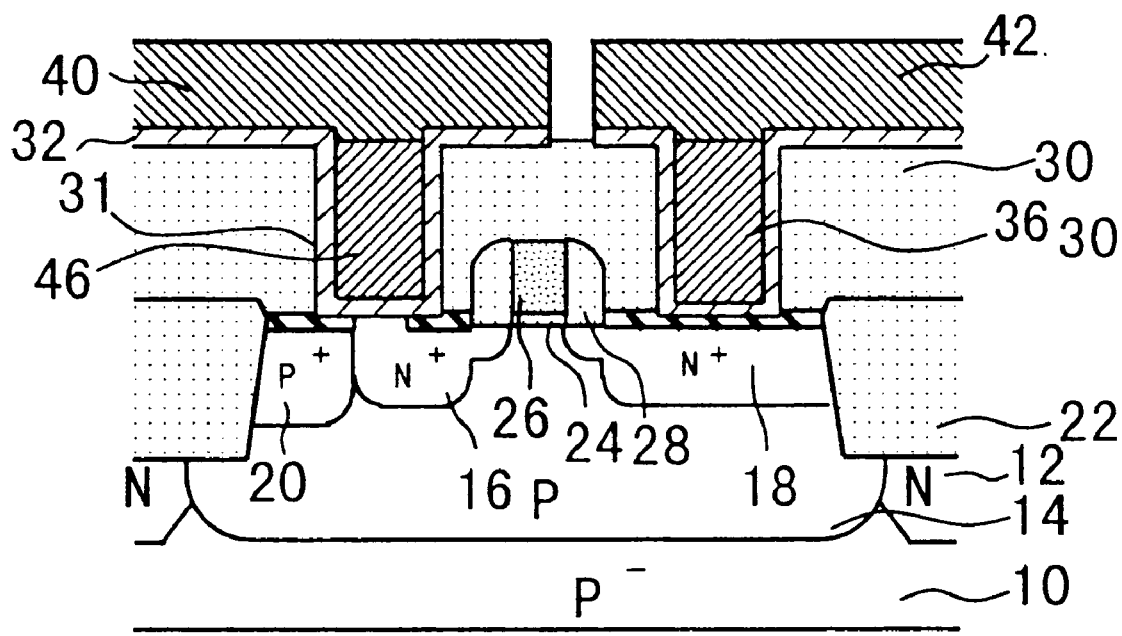
FIG. 8 is a cross-sectional view of a semiconductor device according to a fourth embodiment of the present invention.

FIG. 8 is a cross-sectional view showing a semiconductor device according to the fourth embodiment. The semiconductor device according to the fourth embodiment comprises the n-type source region 16 and a well contact 20 (a p-type high-density region), both of which are formed in the p-well 14. The n-type source region 16 and the well contact 20 are each formed so as to have a flat surface, as well as to be positioned in proximity to each other.

The semiconductor device comprises the dual-purpose contact plug 46 which is in contact with both the n-type source region 16 and the well contact 20, and the second contact plug 36 which is in contact with the n-type drain region 18. With the foregoing structure, the n-type source region 16 and the p-well 14 can be electrically connected together without use of the p-well contact plug 38 (see FIG. 1). Therefore, the degree of integration of the transistor can be improved by means of the semiconductor device according to the fourth embodiment.

The metal silicide layer 29 is formed on the n-type source region 16, the well contact 20, and then n-type drain region 18. As in the case with the third embodiment, the semiconductor device according to the fourth embodiment enables a sufficient reduction in the wiring resistance of the transistor.

In the semiconductor device according to the fourth embodiment, the metal silicide layer 29 formed on the surface of the n-type source region 16 is physically spaced away from the metal silicide layer 29 formed on the surface of the p-type high-density region. Such a structure enables prevention of interdiffusion between the impurities of those metal silicide layers during the process for forming silicide. Accordingly, the semiconductor device according to the fourth embodiment enables imparting of stable characteristics (i.e., stable electrical resistance) to the metal silicide layers 29.

A method of manufacturing the semiconductor device according to the fourth embodiment will now be described by reference to FIGS. 9A to 9D.

Figure 9A:
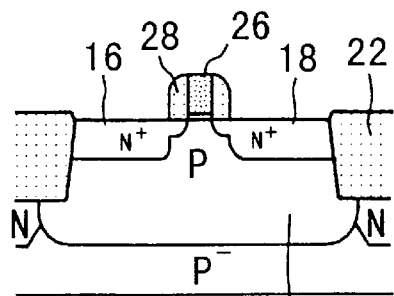
FIG. 9A through 9H are cross-sectional views for describing a manufacturing method of the semiconductor device according to the fourth embodiment of the present invention.

During the process of manufacture of the semiconductor device, the n-type silicon region 16, the n-type drain region 18, and the isolation oxide film 22 are formed on the silicon substrate 10 (FIG. 9A).

Figure 9B:
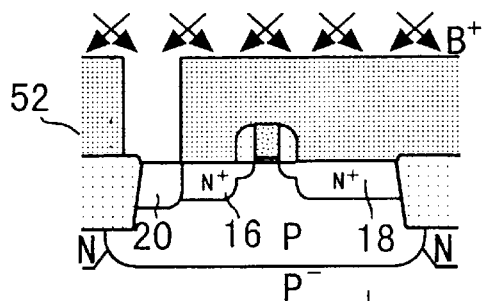

A resist pattern 52 is formed on the isolation oxide film 22 in such a way that an opening is located in a position where the well contact 20 is to be formed. Subsequently, impurities are implanted into the substrate region (the p-well 14 in the fourth embodiment) from above the resist pattern 52. The impurities are of the same conductivity type as those contained in the substrate region (e.g., B ions in the fourth embodiment). The impurities are implanted at a given angle with respect to the silicon substrate 10 while the silicon substrate 10 is rotated. Through the foregoing processing, the p-type high-density region, i.e., the well contact 20 is formed in the p-well 14 so as to be adjacent to the n-type source region 16 (FIG. 9B).

Figure 9C:
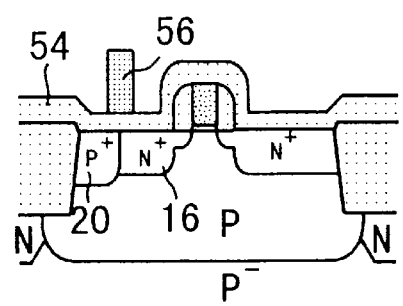

After formation of the well contact 20, an oxide film 54 is formed over the entire surface of the silicon substrate 10. A resist pattern 56 is formed on the oxide film 54 to a predetermined width so as to cover a boundary region between the n-type source region 16 and the well contact 20 (FIG. 9C).

Figure 9D:
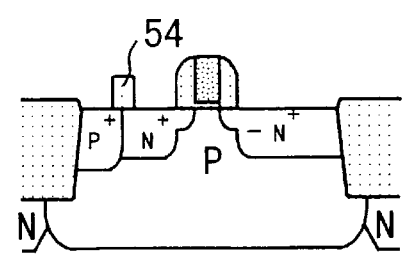

The oxide film 54 is etched while the resist pattern 56 is used as a mask. As a result, the oxide film 54 is left so as to cover solely the boundary region between the n-type source region 16 and the well contact 20. After completion of etching of the oxide film 54, the resist pattern 56 is removed (FIG. 9D).

Figure 9E:
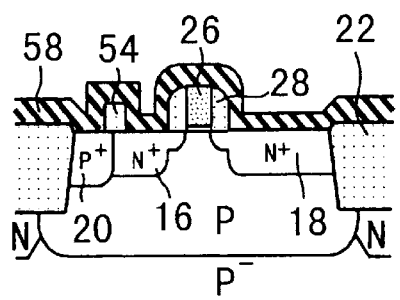

After deposition of a thin film 58 made of Co over the entire surface of the silicon substrate 10, the silicon substrate 10 is subjected to a heat treatment at a temperature of about 450° C. As a result of reaction between silicon and Co, $CoSi_2$ (cobalt silicide) is formed in areas where silicon and Co come into contact; namely, the surface of the n-type source region 16, the surface of the well contact 20, and the surface of the n-type drain region 18. Co that has not reacted with silicon remains in areas where Co is not in contact with silicon; i.e., the surface of the isolation oxide film 22, the surface of the oxide film 54, and the surface of the gate electrode 26 (FIG. 9E).

Figure 9F:
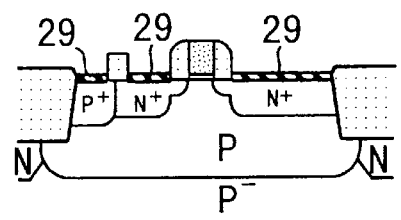

Co that has not reacted is removed from the surface of the silicon substrate 10 through use of a mixed water solution consisting of phosphoric acid, acetic acid, and nitric acid (FIG. 9F).

Figure 9G:
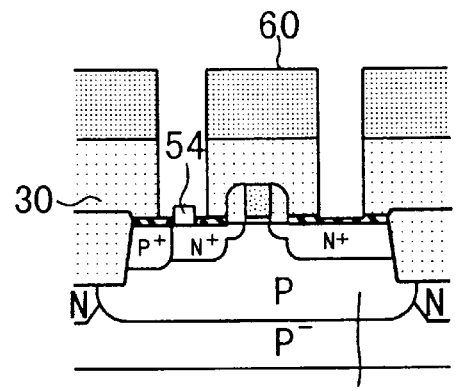

After deposition of the interlayer oxide film 30, a resist pattern 60 to be used for opening the contact holes 31 is formed on the interlayer oxide film 30. The silicon substrate 10 is subjected to etching while the resist pattern 60 is used as a mask, thereby opening the contact hole 31 in a boundary region between the well contact 20 and the n-type source region 16 as well as the contact hole 31 in the n-type drain region 18 (FIG. 9G).

Figure 9H:
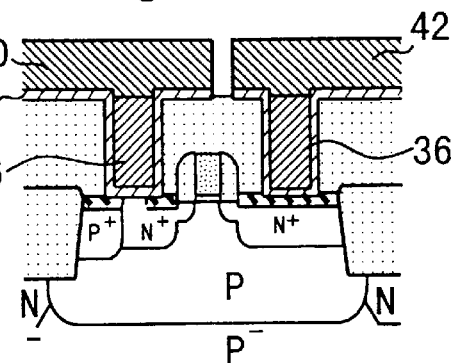

Through exposure of the silicon substrate 10 to subsequent processing steps such as a step of removing the resist pattern 60 and the oxide film 54, a step of glowing the barrier metal layer 32, a step of forming the contact plugs 36 and 46, and a step of forming aluminum wiring patterns 40 and 42, a semiconductor device according to the fourth embodiment is manufactured (FIG. 9H).

Fifth Embodiment

A fifth embodiment of the present invention will now be described by reference to FIGS. 10 through 11J.

Figure 10:
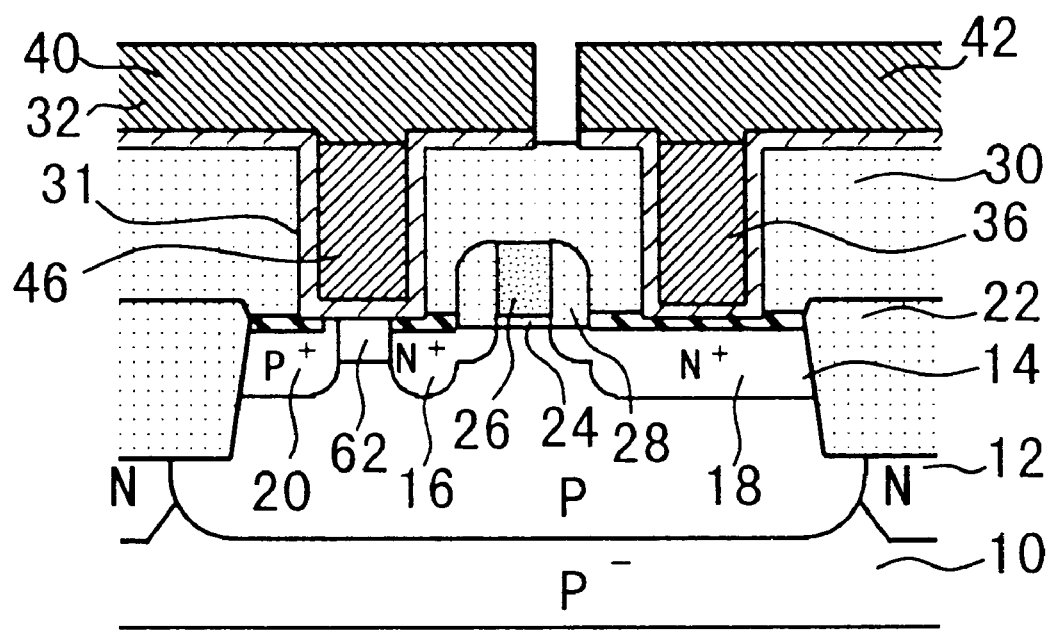
FIG. 10 is a cross-sectional view of a semiconductor device according to a fifth embodiment of the present invention.

FIG. 10 is a cross-sectional view showing a semiconductor device according to the fifth embodiment. The semiconductor device according to the fifth embodiment is identical in structure with that according to the fourth embodiment, except that a n-type low-density region 62 is formed between the n-type source region 16 and the well contact 20. The n-type low-density region 62 contains impurities of the same type as those contained in the n-type source region 16 and at a density lower than that in the n-type source region 16.

The presence of the n-type low-density region 62 between the n-type source region 16 and the well contact 20 enables much greater elongation of a depletion layer arising in a PN junction than in a case where the n-type source region 16 and the well contact 20 are positioned in proximity with each other. As the depletion layer becomes longer, the junction capacitance of the PN junction becomes lower. For this reason, the semiconductor device according to the fifth embodiment can make the junction capacitance of the PN junction lower than can the semiconductor device according to the fourth embodiment (FIG. 8).

A method of manufacturing the semiconductor device according to the fifth embodiment will now be described by reference to FIGS. 11A through 11J.

Figure 11A:
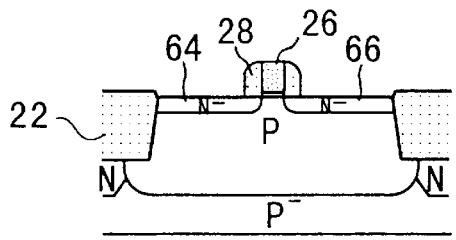
FIGS. 11A through 11J are cross-sectional views for describing a manufacturing method of the semiconductor device according to the fifth embodiment of the present invention.

During the process of manufacture of the semiconductor device, the isolation oxide film 22, the gate electrode 26, and low-density diffusion regions (hereinafter referred to simply as "LDD regions") 64 and 66 are formed on the silicon substrate 10 by means of a publicly-known technique (FIG. 11A). The LDD regions 64 and 66 serve as the foundation of the n-type source region 16 and the n-type drain region 18. The LDD regions 64 and 66 are formed by implanting into the p-well 14 impurities of the same conductivity type as those contained in the n-type source region 16 (or the n-type drain region 18), at a comparatively low density.

Figure 11B:
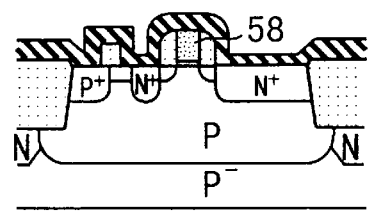
Figure 11C:
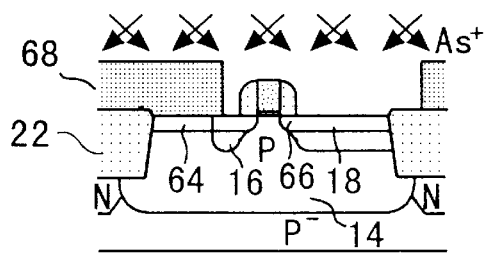

The resist pattern 68 is formed on the isolation oxide film 22 and the LDD regions 64 and 66. The resist pattern 68 has an opening located at an area where the n-type source region 16 and the n-type drain region 18 are to be formed. After formation of the resist pattern 68, impurities (e.g., As ions in the fifth embodiment) which are of a conductivity type opposite that of the impurities contained in the substrate region (i.e., the p-well 14 in the fifth embodiment) are implanted into the LDD regions 64 and 66 from above the resist pattern 68. The impurities are implanted at a given angle relative to the silicon substrate 10 while the silicon substrate 10 is rotated. Through the foregoing processing step, the n-type source region 16 and the n-type drain region 18 are formed in the p-well 14 (FIG. 11B).

Figure 11D:
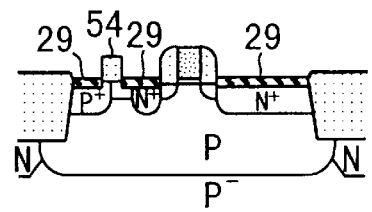

After completion of the foregoing processing, a resist pattern 70 to be used for forming a well contact 20 is formed. The resist pattern 70 has an opening located at a position where a portion of the LDD region 64 still remains in the p-well 14; i.e., an area where the well contact 20 is to be formed. After formation of the resist pattern 70, impurities (e.g., B ions in the fifth embodiment) which are of the same conductivity type as the impurities contained in the substrate region (i.e., the p-well 14 in the fifth embodiment) are implanted into the LDD region 64 from above the resist pattern 70. The impurities are implanted at a given angle relative to the silicon substrate 10 while the silicon substrate 10 is rotated. Through the foregoing processing step, the well contact 20 is formed in the p-well 14 and the n-type low-density region 62 is formed between the n-type source region 16 and the well contact 20 (FIG. 11D).

After the formation of the well contact 20, there is formed an oxide film 54 on the entire surface of the substrate 10. On a the oxide film 54 is formed a resist pattern 72 which covers an certain area including the boundary between the n-type low-density region 62 and the well contact 20 (FIG. 11D).

Figure 11E:
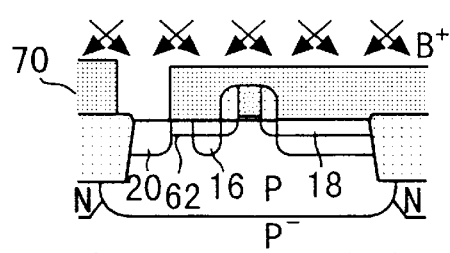

The oxide film 54 is etched while the resist pattern 72 is used as a mask. As a result, the oxide film 54 is left so as to cover solely a boundary region between the n-type low-density region 62 and the well contact 20. After completion of etching of the oxide film 54, the resist pattern 72 is removed (FIG. 11E).

Figure 11F:
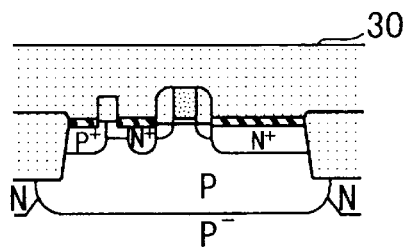

After deposition of the thin film 58 made of Co over the entire surface of the silicon substrate 10, the silicon substrate 10 is subjected to a heat treatment at a temperature of about 450° C. As a result of reaction between silicon and Co, $CoSi_2$ is formed in areas where silicon and Co come into contact. Co that has not reacted with silicon remains in areas where Co is not in contact with silicon (FIG. 11F).

Figure 11G:
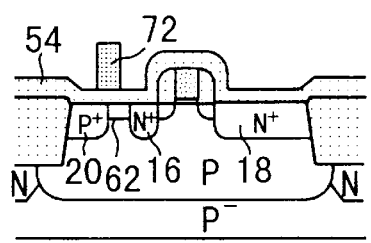
Figure 11H:
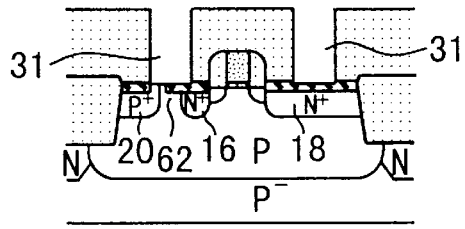

Co that has not reacted is eliminated from the surface of the silicon substrate 10 through use of a mixed water solution containing phosphoric acid, acetic acid, and nitric acid (FIG. 11G).

Figure 11I:
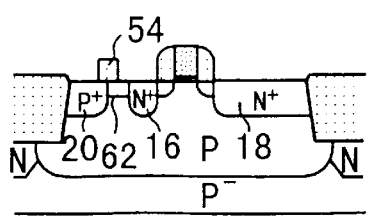

The interlayer insulating film 30 is deposited on the entire surface of the silicon substrate 10 (FIG. 11H), and the contact holes 31 are formed in the interlayer insulating film 30 through etching. One of the contact holes 31 is formed in a position located above the boundary region between the well contact 20 and the n-type low-density region 62, and the other contact hole 31 is formed in a position located above the n-type drain region 18. After opening of the contact holes 31, the oxide film 54 still remaining in the contact hole 31 is eliminated (FIG. 11I).

Figure 11J:
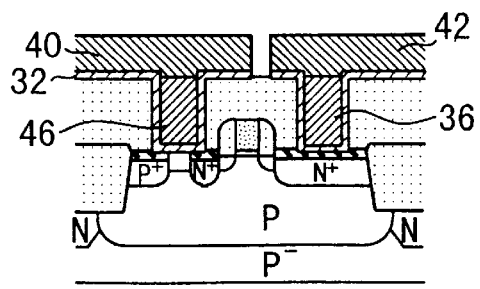

Through exposure of the silicon substrate 10 to the step of forming the barrier metal layer 32, the step of forming the contact plugs 46 and 36, and the step of forming the aluminum wiring layers 40 and 42, the semiconductor device is formed (FIG. 11J).

Sixth Embodiment

A sixth embodiment of the present invention will now be described by reference to FIG. 12 to FIG. 13F.

Figure 12:
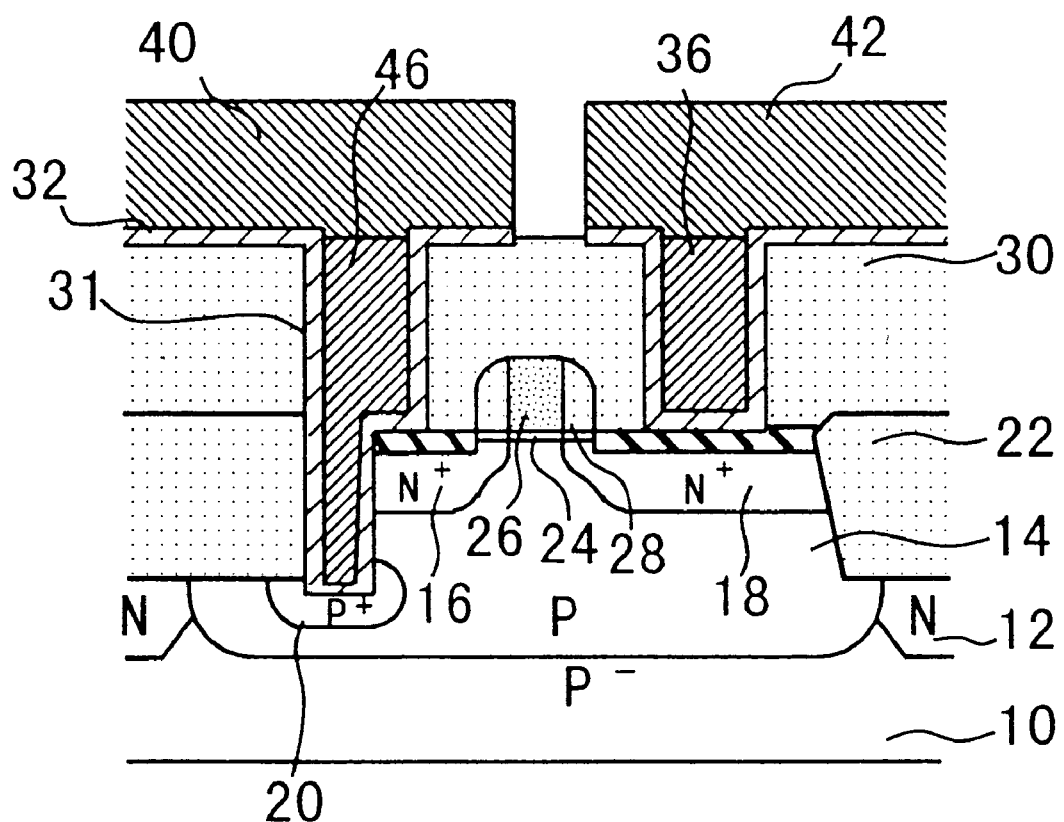
FIG. 12 is a cross-sectional view of a semiconductor device according to a sixth embodiment of the present invention.

FIG. 12 is a cross-sectional view showing a semiconductor device according to the sixth embodiment. The semiconductor device according to the sixth embodiment is identical in structure with that according to the third embodiment (FIG. 6), except that the well contact 20 is formed so as to be spaced apart from the n-type source region 16, and that the p-well 14 remains between the well contact 20 and the n-type source region 16.

When the p-well 14 is left between the n-type source region 16 and the well contact 20, a depletion layer arising in the PN junction can be elongated to a greater (extent than in a case where the n-type source region 16 and the well contact 20 are provided in proximity to each other. Accordingly, as in the case with the fifth embodiment (FIG. 10), the semiconductor device according to the sixth embodiment can make lower the junction capacitance arising between the n-type source region 16 and the well contact 20.

In the semiconductor device according to the sixth embodiment, the well contact 20 and the n-type source region 16 are arranged three-dimensionally. Accordingly, the semiconductor device enables ensuring of a contact area between the well contact 20 and the dual-purpose contact plug 46, which is greater than that ensured in the semiconductor device according to the fifth embodiment (FIG. 10). Thus, according to the semiconductor device, there may be ensured a higher reliability in the contact area between the well contact 20 and the dual-purpose contact plug 46 than that ensured by the semiconductor device according to thee fifth embodiment.

A method of manufacturing the semiconductor device according to the sixth embodiment will now be described by reference to FIGS. 13A to 13F.

Figure 13A:
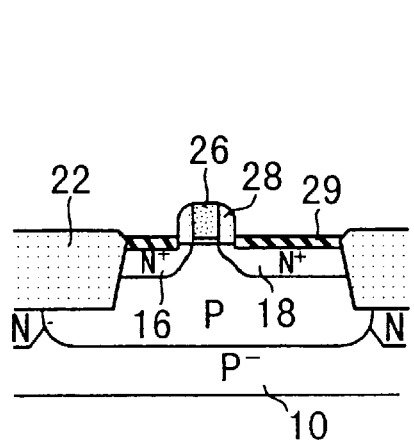
FIGS. 13A through 13F are cross-sectional views for describing a manufacturing method of the semiconductor device according to the sixth embodiment of the present invention.

During the process of manufacture of the semiconductor device according to the sixth embodiment, the n-type source region 16 and the n-type drain region 18 are formed on the silicon substrate 10 by means of a publicly-known technique. Subsequently, the metal silicide layer 29 is formed on the surface of the n-type source region 16 and the n-type drain region 18 through a publicly-known salicide process (FIG. 13A).

Figure 13D:
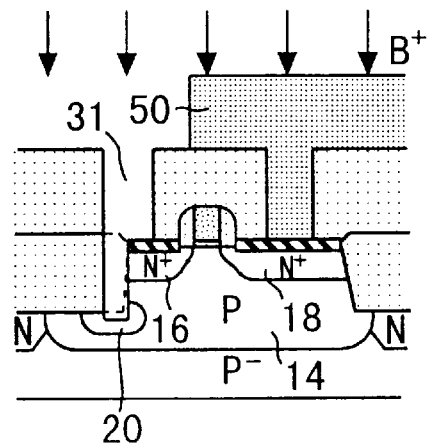
Figure 13B:
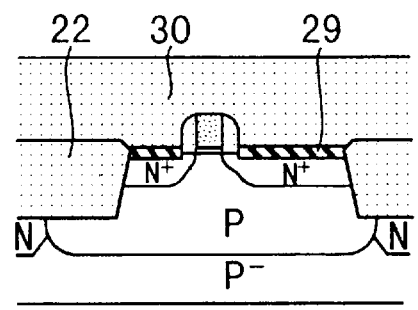
Figure 13E:
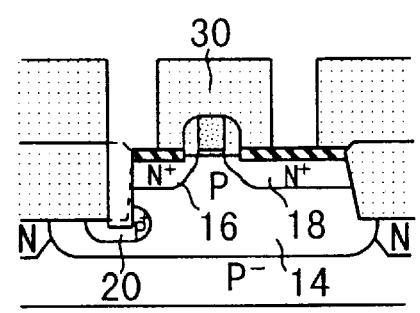
Figure 13C:
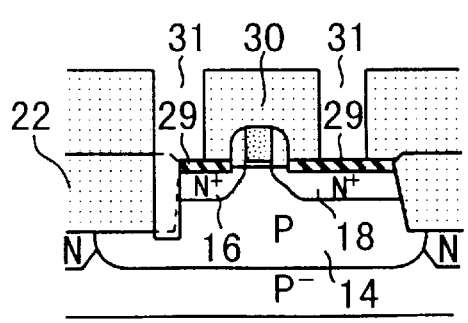

After deposition of the interlayer oxide film 30 on the metal silicide layer 29 and the isolation oxide film 22 (FIG. 13B), the contact holes 31 are formed through dry etching (FIG. 13C). The silicon substrate 10 is subjected to dry etching under condition that a silicon oxide film is removed at a high etch selective ratio with respect to silicon and metal silicide. Consequently, in the area where the contact hole 31 overlaps the metal silicide layer 29, etching action is stopped when the metal silicide layer 29 becomes exposed. In contrast, in the area where the contact hole 31 overlaps the isolation oxide film 22, etching action continues until the p-well 14 becomes exposed.

After opening of the contact holes 31, the resist pattern 50 is formed in such a way that an opening is located in an area where the dual-purpose contact plug 46 is to be formed. Next, impurities are implanted into the exposed substrate region at the bottom of the dual-purpose contact plug 46 (i.e., the p-well 14 in the present embodiment) from above the resist pattern 50. The impurities are of the same conductivity type as those contained in the substrate region (e.g., B ions in the present embodiment). The impurities are implanted at a given angle with respect to the silicon substrate 10 while the silicon substrate 10 is rotated. Through the foregoing processing, the well contact 20 is formed in the contact hole 31 so as to be spaced away from the n-type source region 16 (FIG. 13D).

After the well contact 20 has been formed, the resist pattern 50 is eliminated from the top of the interlayer oxide film 30, and the silicon substrate 10 is annealed in order to activate the impurities (e.g., the substrate is subjected to an lamp annealing step at 1000° C. for 30 sec). (FIG. 13E).

Figure 13F:
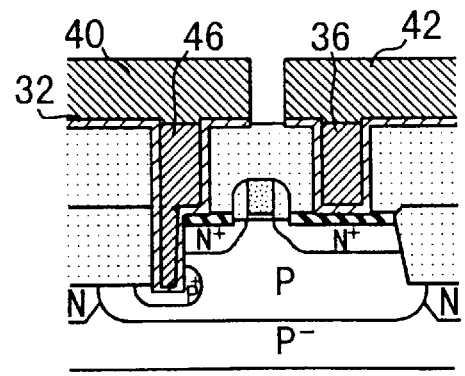

After being subjected to annealing, the silicon substrate 10 is exposed to the step of forming the barrier metal layer 32, the step of forming the contact plugs 36 and 46, and the step of forming the aluminum wiring layers 40 and 42, whereby the semiconductor device according to the sixth embodiment is manufactured (FIG. 13F).

Seventh Embodiment

A seventh embodiment of the present invention will now be described by reference to FIGS. 14 through 17.

Figure 14:
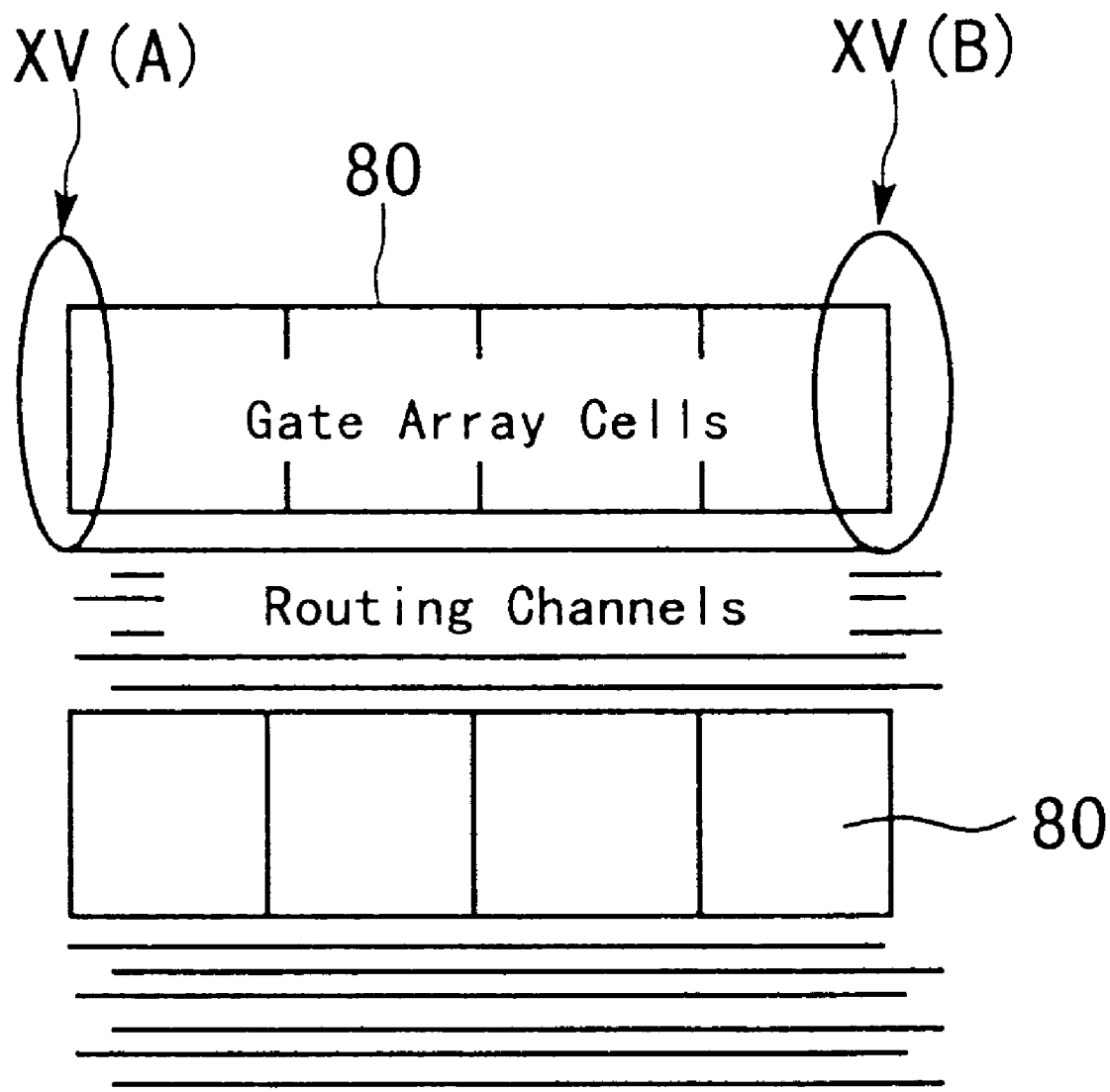
FIG. 14 is a plan view showing the principal elements of a semiconductor device according to the seventh embodiment.

FIG. 14 is a plan view showing the principal elements of a semiconductor device according to the seventh embodiment. As shown in FIG. 14, the semiconductor device according to the seventh embodiment is provided with a plurality of transistor cell arrays 80. Each of the transistor cell arrays 80 comprises a plurality of built-in transistors.

Figure 15:
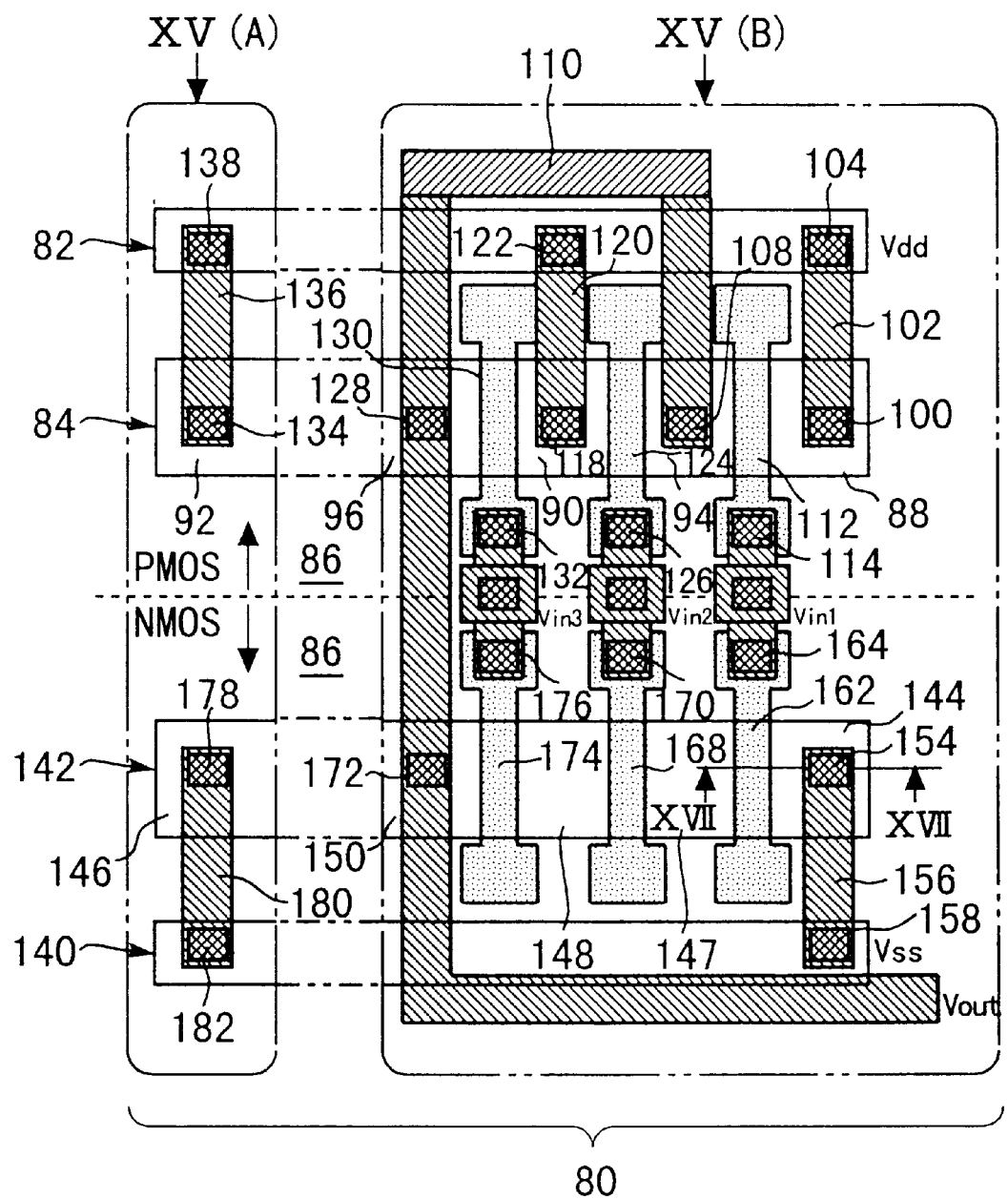
FIG. 15 is an enlarged view showing both ends of the transistor cell array shown in FIG. 14.
Figure 16:
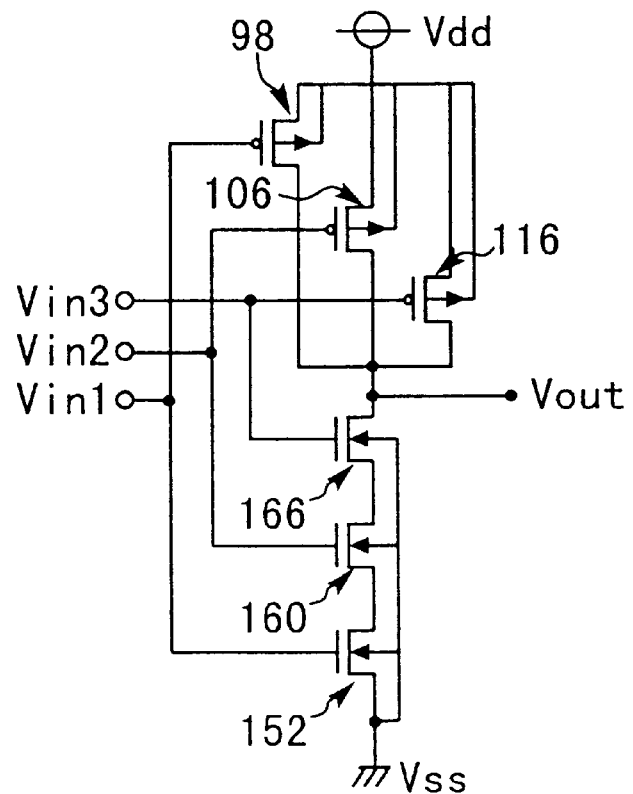
FIG. 16 shows an equivalent circuit of the portion XV(B) shown in FIG. 15.

FIG. 15 is an enlarged view showing both ends of the transistor cell array 80 [i.e., the portions XV(A) and XV(B)]. FIG. 16 is an equivalent circuit of the portion XV(B) of the transistor cell array 80. The equivalent circuit shown in FIG. 16 is a three-input NAND circuit which comprises three PMOS transistors and three NMOS transistors.

In FIG. 15, an area illustrated above a broken line represents an area where PMOS transistors are to be formed. In contrast, an area shown below the broken line represents an area where NMOS transistors are to be formed. In the PMOS region are formed an n-type high-density region 82 and a group of p-type source/drain regions 84. The n-type high-density region 82 and the group of p-type source/drain regions 84 are provided on the surface of the n-well (not shown) and are surrounded by an isolation oxide film 86. In the PMOS region, the n-well mentioned above constitutes the substrate region of the PMOS transistor.

A source voltage Vdd is led to, the n-type high-density region 82 and is also led to the n-well which acts as a substrate region of the PMOS region. The group of p-type source/drain regions 84 comprises a first diffusion region (including regions 88, 90, and 92 shown in FIG. 15) electrically connected to the substrate region (n-well) by way of the n-type high-density region 82, and a second diffusion region (including regions 94 and 96 shown in FIG. 15) not electrically connected to the substrate region.

The first diffusion region 88 acts as the source region of a PMOS transistor 98 provided in then upper stage shown in FIG. 16. The first diffusion region 88 is connected to the n-type high-density region 82 (the substrate region and Vdd) by way of a source contact plug 100, an aluminum wiring layer 102, and a well contact plug 104. The second diffusion region 94 acts as the drain region of the PMOS transistor 98 in the upper stage shown in FIG. 16 and as the drain region of a PMOS transistor 106 provided in the middle stage. The second diffusion region 94 is connected to an aluminum output wiring layer 110 by way of the drain contact plug 108. A gate electrode 112 of the PMOS transistor 98 is provided between the first diffusion region 88 and the second diffusion region 94 and is connected to a first input terminal Vin1 by way of a contact plug 114.

The first diffusion region 90 acts as the source region of the PMOS transistor 106 provided in the middle stage in FIG. 16 and as the source region of a PMOS transistor 116 provided in the lower stage in FIG. 16. Further, the first diffusion region 90 is connected to the n-type high-density region 82 (the substrate region and Vdd) by way of a source contact plug 118, an aluminum wiring layer 120, and a well contact plug 122. A gate electrode 124 of the PMOS transistor 106 is provided between the first diffusion region 90 and the second diffusion region 94. The gate electrode 124 is connected to a second input terminal Vin2 by way of the contact plug 126.

The second diffusion region 96 acts as the drain region of the PMOS transistor 116 provided in the lower stage in FIG. 16 and is connected to the aluminum output wiring layer 110 by way of a drain contact plug 128. A gate electrode 130 of the PMOS transistor 116 is provided between the first diffusion region 90 and the second diffusion region 96 and is connected to a third input terminal Vin3 by way, of a contact plug 132.

The first diffusion region 92 formed in XV (A) acts as the source region of another PMOS transistor to be formed in the PMOS region. Like the other first diffusion regions 88 and 90, a first diffusion region 92 is connected to an n-type high-density region 82 (the substrate region and Vdd) by way of a source contact plug 134, an aluminum wiring layer 136, and a well contact plug 138.

In the NMOS region are formed a p-type high-density region 140 and a group of n-type source/drain regions 142. The p-type high-density region 140 and the group of n-type source/drain regions 142 are provided on the surface of a p-well (not shown) and are surrounded by the isolation oxide film 86. In the NMOS region the p-well constitutes a substrate region of the NMOS transistor.

The p-type high-density region 140 is connected to a ground potential Vss, which is also connected to the p-well serving as the substrate region of the NMOS region. The group of n-type source/drain regions 142 comprises a first diffusion region (including regions 144 and 146 shown in FIG. 15) electrically connected to the substrate region (p-well) by way of the p-type high-density region 140, and a second diffusion region (including regions 147, 148, and 150 shown in FIG. 15) not electrically connected to the substrate region.

The first diffusion region 144 acts as the source region of an NMOS transistor 152 provided in the lower stage in FIG. 16. The first diffusion region 144 is connected to the p-type high-density region 140 (the substrate region and Vss) by way of a source contact plug 154, an aluminum wiring layer 156, and a well contact plug 158. The second diffusion region 147 acts as the drain region of the NMOS transistor 152 provided in the lower stage in FIG. 16 and as the source region of an NMOS transistor 160 provided in the middle stage in FIG. 16. A gate electrode 162 of the NMOS transistor 152 is provided between the first diffusion region 144 and the second diffusion region 147 and is connected to the first input terminal Vin1 by way of a contact plug 164.

A second diffusion region 148 acts as the drain region of the NMOS transistor 160 provided in the middle stage in FIG. 16 and as the source region of an NMOS transistor 166 provided in the upper stage in FIG. 16. A gate electrode 168 of the NMOS transistor 160 is provided between the second diffusion region 147 and the second diffusion region 148. The gate electrode 168 is connected to the second input terminal Vin2 by way of a contact plug 170.

The second diffusion region 150 acts as the drain region of the NMOS transistor 166 provided in the upper stage shown in FIG. 16 and is connected to the aluminum output wiring layer 110 by way of a drain contact plug 172. A gate electrode 174 of the NMOS transistor 166 is provided between the second diffusion region 148 and the second diffusion region 150 and is connected to the third input terminal Vin3 by way of the contact plug 176.

The first diffusion region 146 formed in XV(A) acts as the source region of another NMOS transistor to be formed in the NMOS region. Like the first diffusion region 144, the first diffusion region 146 is connected to the p-type high-density region 140 (the substrate region and Vss) by way of a source contact plug 178, an aluminum wiring layer 180, and a well contact plug 182.

Figure 17:
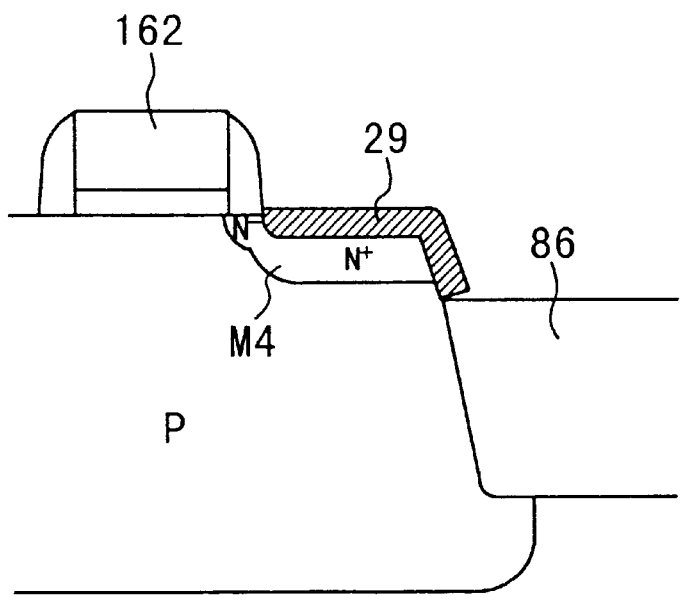
FIG. 17 is a cross-sectional view taken along line XVII—XVII shown in FIG. 15.
Figure 18:
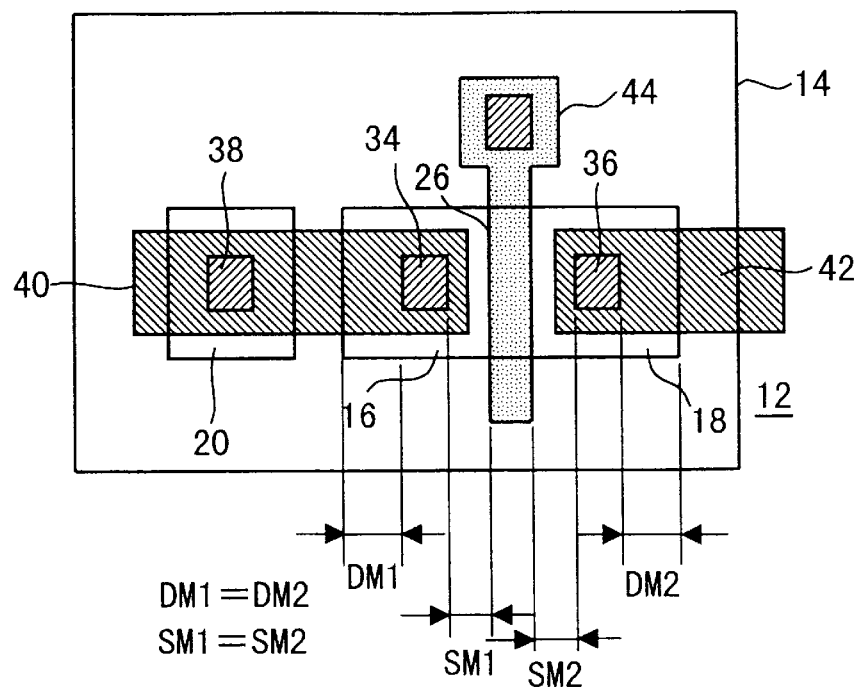
FIG. 18 is a plane view of a layout of a mask used for manufacturing a former semiconductor device.
Figure 19:
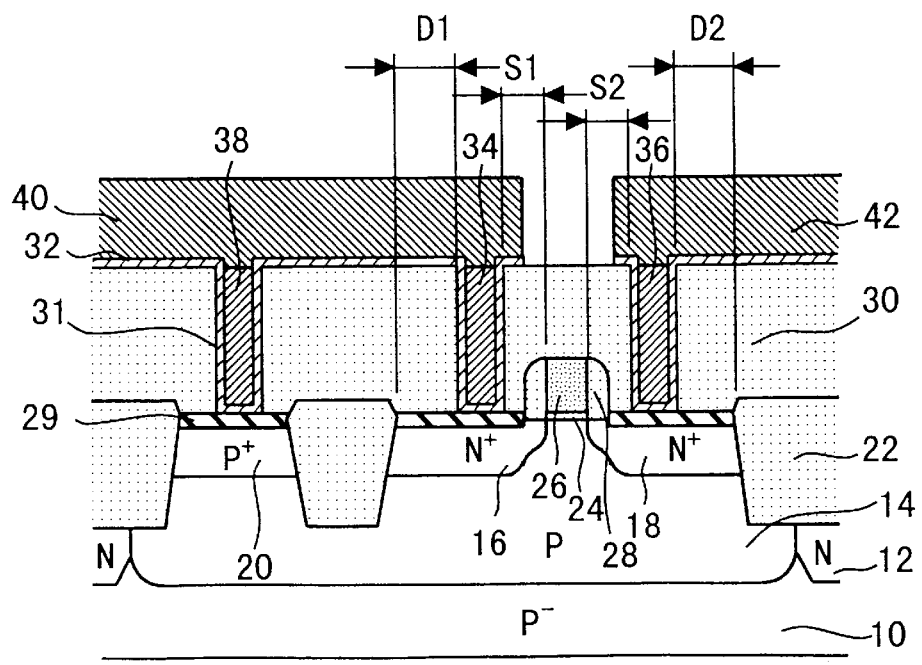
FIG. 19 is a cross-sectional view of the former semiconductor device.

FIG. 17 is a cross-sectional view taken along line XVII—XVII provided in FIG. 15, showing the transistor array 80. During the process of manufacture of the semiconductor device, after formation of the isolation oxide film 86 on the silicon substrate 10, a wafer is subjected to chemical and mechanical polishing (CMP), thereby rendering a wafer surface smooth. As shown in FIG. 17, as a result of the wafer containing the transistor array 80 being subjected to CMP, the surface of the isolation oxide film 86 surrounding the transistor array 80 becomes lower than the surface of the diffusion region (an area where the source or drain region of the transistor is to be formed).

During the manufacture of the semiconductor device, the transistor is formed after the wafer has been subjected to CMP. There is a case where a metal silicide layer is formed on the surface of an activated region of silicon in order to reduce the parasitic resistance of the transistor. As shown in FIG. 17, while the surface of the isolation oxide film 86 is made lower than the surface of the first diffusion region 144, the diffusion region 144 may be electrically connected to the substrate region (p-well) by means of the metal silicide layer 29. That is, in the semiconductor device containing the transistor cell array 80, a short circuit may arise between the substrate region and the diffusion region located at the end of the transistor array 80.

As shown in FIG. 15, in the semiconductor device according to the seventh embodiment, the first diffusion regions 88, 92, 144, and 146 are provided at the end of the transistor cell array 80. The first diffusion regions 88, 92, 144, and 146 are used while being electrically connected to the substrate region. Thus, even if those regions are short-circuited as a result of formation of the metal silicide layer 29, the characteristic of the transistor memory array will not be deteriorated.

In the semiconductor device, a circuit pattern of the transistor cell array 80 is set in such a way that the n-type high-density region 82 and the p-type high-density region 140 are disposed outside the group of p-type source/drain regions 84 and the group of n-type source/drain region 142. In this case, there can be prevented depression of the isolation oxide film 22 adjoining the diffusion region, i.e., a short-circuit between the diffusion region and the substrate region, which would otherwise be caused in a case where the group of p-type source/drain regions 84 and the group of n-type source/drain regions 142 are disposed in the outermost positions in the transistor cell array. Therefore, the semiconductor device according to the seventh embodiment enables effective prevention of faulty operations of the transistor cell array 80.

Although the semiconductor device according to the seventh embodiment does not employ any structure for increasing the degree of integration of the transistor, the degree of integration of the transistor may be increased through use of the structure as described in any of the first through sixth embodiments.

The major benefits of the present invention described above are summarized as follows:

Since the semiconductor device according to the present invention has the aforementioned configurations, the device yields the following advantageous results:

According to a first aspect of the present invention, there is provided a small diffusion region which is used while being electrically connected to a substrate region, thus enabling implementation of a high-density semiconductor device.

According to a second aspect of the present invention, an identical distance between the gate( electrode and the contact plug is ensured in any of the diffusion regions. Accordingly, even in the diffusion region which is used while being electrically connected to the substrate region, an unintentional short circuit can be prevented from occurring between a contact plug and a gate electrode.

According to a third aspect of the present invention, there is provided a dual-purpose contact plug which enables implementation of a wiring structure for connecting the diffusion region to an external element and a wiring structure for electrically connecting the diffusion region to the substrate region. As a result, according to the present invention, a high-density semiconductor device can be realized.

According to a fourth aspect of the present invention, a level difference portion is formed in the end of the dual-purpose contact plug, so that a larger contact area is ensured between the diffusion region and the dual-purpose contact plug and between the substrate region and the dual-purpose contact plug.

According to a fifth aspect of the present invention, a flat end surface of the dual-purpose contact plug is in contact with both the diffusion region and the substrate region at the plane end surface. The structure of the dual-purpose contact plug can be realized by plainly forming the diffusion region and the substrate region. Accordingly, the structure of the semiconductor device according to the present invention can be realized through simple manufacturing processes.

According to a sixth aspect of the present invention, a metal silicide layer is formed in the diffusion region, and hence the resistance of the wiring layers connected to the diffusion region can be reduced to a small value.

According to a seventh aspect of the present invention, the portions of the diffusion region and the substrate region which are in contact with the dual-purpose contact plug are plainly formed, and the metal silicide layer is formed on the individual contact surfaces. Therefore, the wiring resistance between the dual-purpose contact plug and the diffusion region and the wiring resistance between the dual-purpose contact plug and the substrate region can be reduced to small values. Further, according to the present invention, the metal silicide layer formed on the diffusion region and the metal silicide layer of the substrate region are formed so as to be spaced away from each other, thereby enabling prevention of interdiffusion of impurities implanted to the metal silicide layers. Accordingly, stable characteristics can be imparted to two metal silicide layers.

According to an eighth aspect of the present invention, a high-density region having an impurity concentration higher than that of the substrate region is formed in the area where the dual-purpose contact plug and the substrate region are in contact with each other. In the area where the dual-purpose contact plug is in contact with semiconductor material, a more superior ohmic characteristic is achieved with an increase in an impurity concentration of the semiconductor material. In the structure of the semiconductor device according to the present invention, the dual-purpose contact p)lug is electrically connected to the substrate region by way of the high-density region having a high concentration of impurities, so that a superior electrical characteristic is realized between the dual-purpose contact plug and the substrate region.

According to ninth through thirteenth aspects of the present invention, the diffusion region in contact with the dual-purpose contact plug (i.e., an area where the source/drain region of the transistor is to be formed) and the high-density region in contact with the substrate are formed so as to be spaced away from each other while a low-density region is interposed therebetween. In this case, the length of a depletion layer formed between the diffusion region and the high-density region becomes greater than that formed in a case where the diffusion region and the high-density region are in contact with each other. As the length of the depletion layer becomes longer, junction capacitance of a PN junction becomes lower. Therefore, the junction capacitance of a junction between the diffusion region and the high-density region can be reduced.

According to a twelfth aspect of the invention, among diffusion regions of a transistor provided at the outermost position of a transistor cell array, a region which is used while being electrically connected to a substrate region is disposed at a peripheral portion of a semiconductor device. During an element isolation step in which a shallow trench isolation technique is used, a trench is formed and an oxide film is embedded into the trench. The wafer is made smooth through CMP. An isolation oxide film in the vicinity of the edge of the semiconductor device is apt to become excessively abraded in the CMP step, and hence a short circuit is likely to arise between a diffusion region and a substrate region. According to the present invention, since a diffusion region which is used while being electrically connected to the substrate region is disposed along the periphery of the semiconductor device, the electrical characteristic of the semiconductor device is prevented from being deteriorated even if the isolation oxide film is abraded excessively.

According to a thirteenth aspect of the present invention, a high density region is formed outside the transistor cell array. In this case, the center region of the semiconductor device is allocated to the transistor cell array, thereby effectively preventing a short circuit between the diffusion region and the substrate region of the transistor cell array. Although the high density region and the substrate region become apt to be short-circuited, since an electrical potential equal to that of the substrate region is introduced to the high density region, there is prevented deterioration of electrical characteristic of the semiconductor device, which would otherwise be caused by a short circuit.

Further, the present invention is not limited to these embodiments, but variations and modifications may be made without departing from the scope of the present invention.

The entire disclosure of Japanese Patent Application No. Hei 10-290528 filed on Oct. 13, 1993 including specification, claims, drawings and summary are incorporated herein by reference in its entirety.

What is claimed is:

1. A semiconductor device including in a substrate region first and second diffusion regions, the device comprising:

a dual-purpose contact plug electrically connected to both the first diffusion region and the substrate region; and a second contact plug electrically connected to the second diffusion region, wherein a level difference is formed between a portion of the dual-purpose contact plug in contact with the first diffusion region and a portion of the same in contact with the substrate region.

2. The semiconductor device according to claim 1, wherein the dual-purpose contact plug has a flat end face which is in contact with both the first diffusion region and the substrate region.

3. The semiconductor device according to claim 1, wherein a metal silicide layer is formed on the surface of the first diffusion region and the surface of the second diffusion region.

4. A semiconductor device including in a substrate region first and second diffusion regions, the device comprising:

a dual-purpose contact plug electrically connected to both the first diffusion region and the substrate region; and a second contact plug electrically connected to the second diffusion region, wherein:

the dual-purpose contact plug has a flat end face which is in contact with both the first diffusion region and the substrate region; and a metal silicide layer is formed in an area where the first diffusion region is in contact with the dual-purpose contact plug as well as in an area where the substrate region is in contact with the dual-purpose contact plug, and the metal silicide layers are spaced away from each other.

5. A semiconductor device including a substrate region first and second diffusion regions, the device comprising:

a dual-purpose contact plug electrically connected to both the first diffusion region and the substrate region; and a second contact plug electrically connected to the second diffusion region, wherein impurities of the same conductivity type as impurities contained in the substrate region are contained in the area where the substrate region and the dual-purpose contact plug are in contact with each other, at a density higher than in the substrate region, wherein the second contact plug is electrically isolated from the dual-purpose contact plug.

6. A semiconductor device including in a substrate region first and second diffusion regions, the device comprising:

a dual-purpose contact plug electrically connected to both the first diffusion region and the substrate region; and a second contact plug electrically connected to the second diffusion region, wherein impurities of the same conductivity type as impurities contained in the substrate region are contained in the area where the substrate region and the dual-purpose contact plug are in contact with each other, at a density higher than in the substrate region, wherein the first diffusion region is spaced away from the area where the substrate region and dual-purpose contact plug are in contact with each other.

7. The semiconductor device according to claim 6, wherein impurities of the same conductivity type as impurities contained in the first diffusion region are contained between the first diffusion region and the area where the substrate region and dual-purpose contact plug are in contact with each other at a density lower than in the first diffusion region.

8. The semiconductor device according to claim 6, wherein a substrate region is interposed between the first diffusion region and the area where the substrate region and dual-purpose contact plug are in contact with each other.

9. A semiconductor device including a transistor cell array made of a plurality of transistors, wherein each of the plurality of transistors comprises in a substrate region first and second diffusion regions;

the first diffusion region is provided so as to become short-circuited with the substrate region;

the second diffusion region is provided so as to cause a great potential difference between the second diffusion region and the substrate region, wherein the potential difference is greater than that arising between the substrate region and the first diffusion region;

a high density region to be electrically connected to the first diffusion region is formed in the substrate region;

the high density region contains impurities which are of the same conductivity type as impurities contained in the substrate region, at a density higher than in the substrate region; and the high density region is provided at a peripheral portion of the transistor cell array.

* * * * *